United States Patent
Paikin et al.

(10) Patent No.: US 10,571,511 B2
(45) Date of Patent: Feb. 25, 2020

(54) SYSTEMS AND METHODS FOR DYNAMIC RDSON MEASUREMENT

(71) Applicant: Texas Instruments Incorporated, Dallas, TX (US)

(72) Inventors: Alex Paikin, Sunnyvale, CA (US); Colin Johnson, San Jose, CA (US); Tathagata Chatterjee, Allen, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/130,035

(22) Filed: Sep. 13, 2018

(65) Prior Publication Data

US 2019/0011493 A1 Jan. 10, 2019

Related U.S. Application Data

(62) Division of application No. 15/395,907, filed on Dec. 30, 2016, now Pat. No. 10,101,382.

(51) Int. Cl.
*G01R 31/10* (2006.01)
*G01R 31/26* (2020.01)
*G01R 31/28* (2006.01)

(52) U.S. Cl.
CPC ..... *G01R 31/2628* (2013.01); *G01R 31/2642* (2013.01); *G01R 31/2849* (2013.01)

(58) Field of Classification Search
CPC ............... G01R 31/2628; G01R 31/28; G01R 31/2849; G01R 31/2887; G01R 31/2896;
(Continued)

(56) References Cited

U.S. PATENT DOCUMENTS 5,519,331 A     5/1996 Cowart et al.
5,959,464 A  *  9/1999 Qualich ............. G01R 19/0092
                                                324/750.06
(Continued)

OTHER PUBLICATIONS

Kim et al., "Rdson Stability of GaN High Voltage Power Devices Post Long-Term Stress: A New Method to Screen Unstable Rdson Performers," CS MANTECH Conference, May 18-21, 2015, Scottsdale, Arizona, USA, pp. 315-318.

*Primary Examiner* — Thang X Le
(74) *Attorney, Agent, or Firm* — Jacqueline J. Garner; Charles A. Brill; Frank D. Cimino (57) ABSTRACT

In at least some embodiments, a system comprises a socket gate terminal configured to receive a first voltage to activate and inactivate a device under test (DUT) coupled to the socket gate terminal. The system also comprises a socket source terminal configured to provide a reference voltage to the DUT. The system further comprises a socket drain terminal configured to provide a second voltage to the DUT to stress the DUT when the DUT is inactive. The socket drain terminal is further configured to receive a third voltage to cause a current to flow through a pathway in the DUT between the socket drain terminal and the socket source terminal when the DUT is active. The socket drain terminal is further configured to provide a fourth voltage indicative of a resistance of the pathway in the DUT when the DUT is active and is heated to a temperature above an ambient temperature associated with the system.

15 Claims, 8 Drawing Sheets

(58) Field of Classification Search
CPC ............ G01R 31/2886; G01R 31/0408; G01R 31/0483; G01R 31/0466; G01R 31/0433; G01R 31/2893; G01R 31/2851; G01R 1/07342; G01R 1/06711; G01R 1/06738; G01R 1/06772; G01R 31/31924; G01R 31/3004; G01R 31/2884; G01R 31/31922
See application file for complete search history.

(56) References Cited

U.S. PATENT DOCUMENTS

| | | | |
|---|---|---|---|
| 7,183,791 B2* | 2/2007 | Walker | G01R 31/2642 324/762.09 |
| 8,629,481 B2 | 1/2014 | Nishimura et al. | |
| 8,692,571 B2* | 4/2014 | Lai | G01R 31/2642 324/762.01 |
| 2002/0030506 A1 | 3/2002 | Chen | |
| 2002/0186032 A1 | 12/2002 | Okabe | |
| 2004/0016977 A1 | 1/2004 | Miyazaki et al. | |
| 2005/0192773 A1 | 9/2005 | Sheng et al. | |
| 2006/0282804 A1* | 12/2006 | Ang | G01R 31/2628 257/48 |
| 2008/0024152 A1 | 1/2008 | Sheng et al. | |
| 2012/0259575 A1* | 10/2012 | Graas | G01R 31/3187 702/120 |

* cited by examiner

SYSTEMS AND METHODS FOR DYNAMIC RDSON MEASUREMENT

CROSS REFERENCE TO RELATED APPLICATIONS

This application is a divisional of U.S. Nonprovisional patent application Ser. No. 15/395,907, filed Dec. 30, 2016, the contents of which is herein incorporated by reference in its entirety.

BACKGROUND

The present disclosure relates generally to validation of the time dependence of the ON-state drain-source resistance (Rdson), after high voltage stress in the OFF state. Rdson is a key figure-of-merit for high-voltage Gallium Nitride (GaN) MOSFETs (GaNFETs). At high temperature, some GaNFETs may exhibit a degradation of the on-state drain-source resistance (Rdson) after being subject to high drain-source voltage (Vds) in the off state. This phenomenon, which may also be referred to as current collapse, reflects the drop in drain-source current that is a corollary to the increase in Rdson. The phenomenon is transient and temperature dependent. At high temperature, this transient Rdson evolves very quickly—for example, in less than one second—after the GaNFET is switched on. An accurate estimate of the transient Rdson is advantageous in assessing GaNFET performance and in screening of devices that exhibit current collapse. Thus, there is a need in the art for systems and methods that enable the continuous estimation of transient Rdson on a plurality of parts effectively simultaneously and at preselected temperatures in excess of ambient temperatures.

SUMMARY

In at least some embodiments, a system comprises a socket gate terminal configured to receive a first voltage to activate and inactivate a device under test (DUT) coupled to the socket gate terminal. The system also comprises a socket source terminal configured to provide a reference voltage to the DUT. The system further comprises a socket drain terminal configured to provide a second voltage to the DUT to stress the DUT when the DUT is inactive. The socket drain terminal is further configured to receive a third voltage to cause a current to flow through a pathway in the DUT between the socket drain terminal and the socket source terminal when the DUT is active. The socket drain terminal is further configured to provide a fourth voltage indicative of a resistance of the pathway in the DUT when the DUT is active and is heated to a temperature above an ambient temperature associated with the system. Such embodiments may be supplemented using one or more of the following concepts, in any order and in any combination: further comprising a driver coupled to the socket gate terminal and configured to provide the first voltage; further comprising a decoder coupled to the driver and configured to enable and disable the driver in accordance with an enable signal and with a digital code corresponding to the driver; further comprising a first power supply coupled to the socket drain terminal and configured to provide the second voltage to the socket drain terminal; further comprising a second power supply coupled to the socket drain terminal and configured to provide the third voltage to the socket drain terminal; wherein the second voltage is higher than the third voltage; further comprising an analog-to-digital converter (ADC) coupled to the socket drain terminal and configured to provide a digital representation based on the fourth voltage present at the socket drain terminal; further comprising multiple, additional sockets configured to couple to different DUTs, and further comprising a plurality of drivers configured to activate the different DUTs sequentially; further comprising a calibration fixture comprising another socket gate terminal, another socket source terminal, another socket drain terminal, a fuse coupled to the another socket drain terminal, and a diode coupled to the fuse, wherein a voltage drop across the fuse and the diode indicates a stability level of the temperature; further comprising a controller subsystem configured to measure a signal that is based on the fourth voltage when the voltage drop indicates that the temperature has stabilized at a preselected level.

At least some embodiments are directed to a method that comprises applying a stress voltage to a drain of each of multiple devices under test (DUTs), where each of the DUTs is maintained within a preselected temperature range. The method also comprises turning on each of the multiple DUTs for a preselected time interval by turning on a respective driver coupled to a gate of each of the multiple DUTs, where turning on a DUT causes a drain-source current to flow through that DUT. The method further comprises measuring a plurality of voltages, with each of the plurality of voltages based on a drain-source voltage of a different one of the multiple DUTs when that DUT is on. The method additionally includes turning off each of the multiple DUTs by turning off the respective drivers corresponding to the DUTs. These embodiments may be supplemented using one or more of the following concepts, in any order and in any combination: further comprising repeating the turning on, measuring, and turning off for a preselected test duration; wherein the preselected temperature is greater than an ambient temperature associated with the multiple DUTs; wherein turning on each of the multiple DUTs comprises sequentially turning on the DUTs, and wherein turning off each of the multiple DUTs comprises sequentially turning off the DUTs; further comprising determining that the preselected temperature has stabilized before applying the stress voltage and turning on each of the multiple DUTs; wherein determining that the preselected temperature has stabilized comprises measuring a total voltage drop across a diode and a fuse on a calibration fixture subject to the preselected temperature; wherein each of the plurality of voltages includes the corresponding drain-source voltage and another total voltage drop across another diode and another fuse, the another diode shares an electrical characteristic with the diode and the another fuse shares another electrical characteristic with the fuse; further comprising determining a drain-source resistance for each of the multiple DUTs using the drain-source current corresponding to that DUT and the measured voltage corresponding to that DUT.

At least some embodiments are directed to a system comprising a plurality of sockets, with each socket comprising drain, source, and gate terminals and configured to receive a device under test (DUT). The system also comprises a first power supply configured to provide a stress voltage to each of the DUTs via the drain terminals. The system further includes a plurality of drivers, each driver coupled to a different one of the gate terminals and configured to provide a first voltage to each of the gate terminals to activate a DUT corresponding to that gate terminal. The system still further includes a second power supply coupled to each of the plurality of sockets via a diode and a fuse, with the second power supply configured to cause a drain-source current to flow between the drain and source terminals via the DUT in each of the plurality of sockets when that DUT is activated. The system still further comprises a controller subsystem coupled to the plurality of sockets and configured to measure a second voltage for each of the plurality of sockets, with the second voltage including a drain-source voltage between the drain and source terminals for that socket. The controller subsystem is configured to perform the measurements when the system corresponds to a temperature within a preselected temperature range. Such embodiments may be supplemented using the following concept: further comprising a calibration fixture comprising another diode and another fuse coupled to another socket, and wherein the controller subsystem monitors a total voltage across the another diode and the another fuse to determine whether the temperature is within the preselected temperature range.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The term "based on" means based at least in part on. In the following description of the various embodiments, the terms "assert," "negate" and various grammatical forms thereof are used to avoid confusion when dealing with a mixture of "active high" and "active low" logic signals. "Assert" is used to refer to the rendering of a logic signal, register bit or control signal into its active, or logically true, state. "Negate" is used to refer to the rendering of a logic signal, register bit, or control signal into its inactive, or logically false, state. "Exemplary," as used herein, means "serving as an example, instance, or illustration." An embodiment described herein as "exemplary" is not necessarily to be construed as preferred or advantageous over other embodiments. "About," as used herein in conjunction with a numerical value, shall mean the recited numerical value, accounting for generally accepted variation in measurement, manufacture, and the like in the relevant industry.

Figure 1:
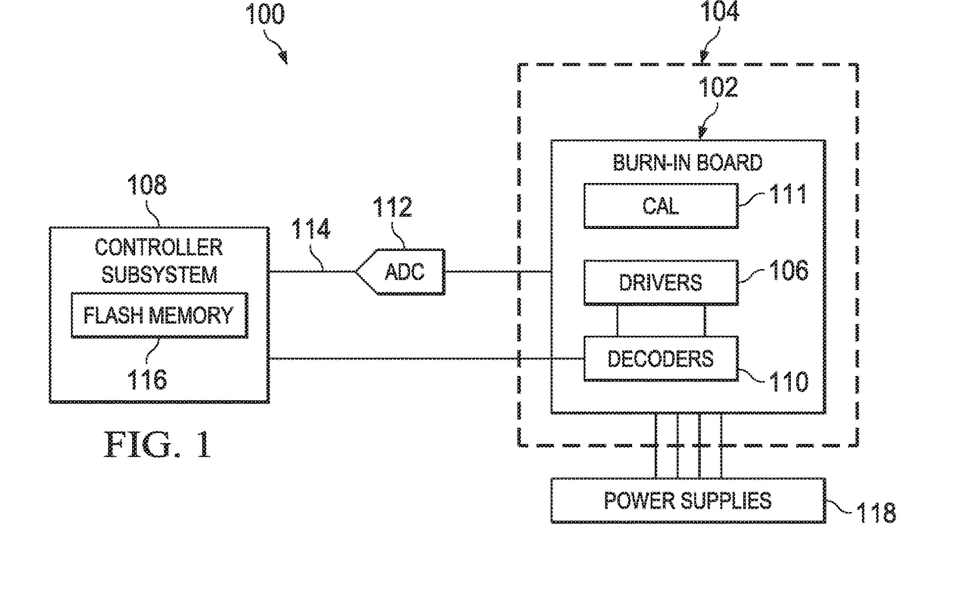
FIG. 1 shows a block diagram of a system in accordance with various examples.

At least some of the embodiments disclosed herein are directed to systems and methods for measuring the transient Rdson in GaNFETs after exposure to a high-voltage Vds in the "off" state of the device. FIG. 1 shows a block diagram of an illustrative system 100 in accordance with embodiments. System 100 may be used to characterize Rdson in a plurality of GaNFET devices under test (DUTs). System 100 includes an illustrative burn-in board 102 configured to hold a plurality of DUTs. A top view (or block diagram) of a burn-in board 102 that may be used in conjunction with system 100 is depicted in and described with respect to FIGS. 2A-2B. When disposed within an interior volume of an oven 104 configured to maintain its interior volume and the contents thereof at a preselected temperature (or a preselected temperature range), a burn-in board 102 and the DUTs inserted thereon can be maintained at the preselected temperature (or within a preselected temperature range). Oven 104 is depicted with dashed lines in FIG. 1 to denote that, in at least some embodiments, it is not an intrinsic component of system 100 but part of an external burn-in environment. Each of drivers 106 is coupled to a respective gate of each of the DUTs (not shown in FIG. 1) when the devices are inserted into a socket (not shown in FIG. 1) on a burn-in board 102. Drivers 106 supply a gate voltage to the DUTs. As described in further detail below, responsive to signals from controller subsystem 108, each driver 106 may control the voltage applied to the gate of its respective DUT to switch the DUT from its "off" state to its "on" state (and vice versa). Consistent with the present disclosure, a GaNFET device is substantially non-conducting in its off state. For example, a GaNFET device is substantially non-conducting where no current flows or very little current (e.g., about 60 nanoamps at a drain-source voltage of about 480 V) flows between the drain and source of the GaNFET device. Conversely, in the on state, the GaNFET device is conducting between the drain and source. In operation, a GaNFET device is switched between on and off states under the control of a voltage applied to the gate electrode. Controller subsystem 108 is configured to repeatedly and sequentially turn on each of the DUTs for a preselected time interval. In one aspect, controller subsystem 108 is configured to cycle through each DUT that is inserted in burn-in board 102, according to a preselected number of off states and on states. In at least some embodiments, drivers 106—and, by extension, the respective DUTs—are controlled via decoders 110 coupled to controller subsystem 108. A calibration fixture (CAL) 111 included on burn-on board 102 is described below in conjunction with FIGS. 3 and 4.

Analog-to-digital converters (ADCs) 112 couple to burn-in board 102 and to the drains of each DUT when the DUTs are inserted in the burn-in board 102. Outputs 114 of the ADCs 112 are provided to controller subsystem 108 and may be stored in a flash memory 116 for subsequent analysis and/or display. Although ADCs 112 are shown as freestanding devices in FIG. 1, in at least some embodiments, ADCs 112 may alternatively be implemented as components of controller subsystem 108. As described further below, outputs 114 of the ADCs 112 may be used to determine the on state Vds of the respective DUT. As each DUT is repeatedly cycled through the off states and on states, the evolution in time of the outputs 114 provides a measure of the dynamic Rdson in those DUTs that exhibit current collapse.

Power supplies 118 provide electrical power to the circuitry on burn-in board 102 and to the DUTs when inserted in burn-in board 102 and under test. As described further below, power supplies 118, in at least some embodiments, may provide the requisite voltages and currents for the drivers 106 and decoders 110. Further, power supplies 118, in at least some embodiments, include high-voltage supplies (e.g., about 500 volts) that are configured to provide high-voltage stress at the drains of the DUTs when the DUTs are in their off states. A low voltage (e.g., about 50 volts), high-current (e.g., 1 amp) supply is included in at least some embodiments of power supplies 118 such that at least one of the power supplies 118 is configured to provide a drain current Ids in each DUT when the DUTs are in their "on" states. Rdson—and, particularly, the change in Rdson that is characteristic of current collapse in the afflicted DUTs—may then be determined by measurement of a voltage that is based on the on-state Vds, as described further below.

Figure 2A:
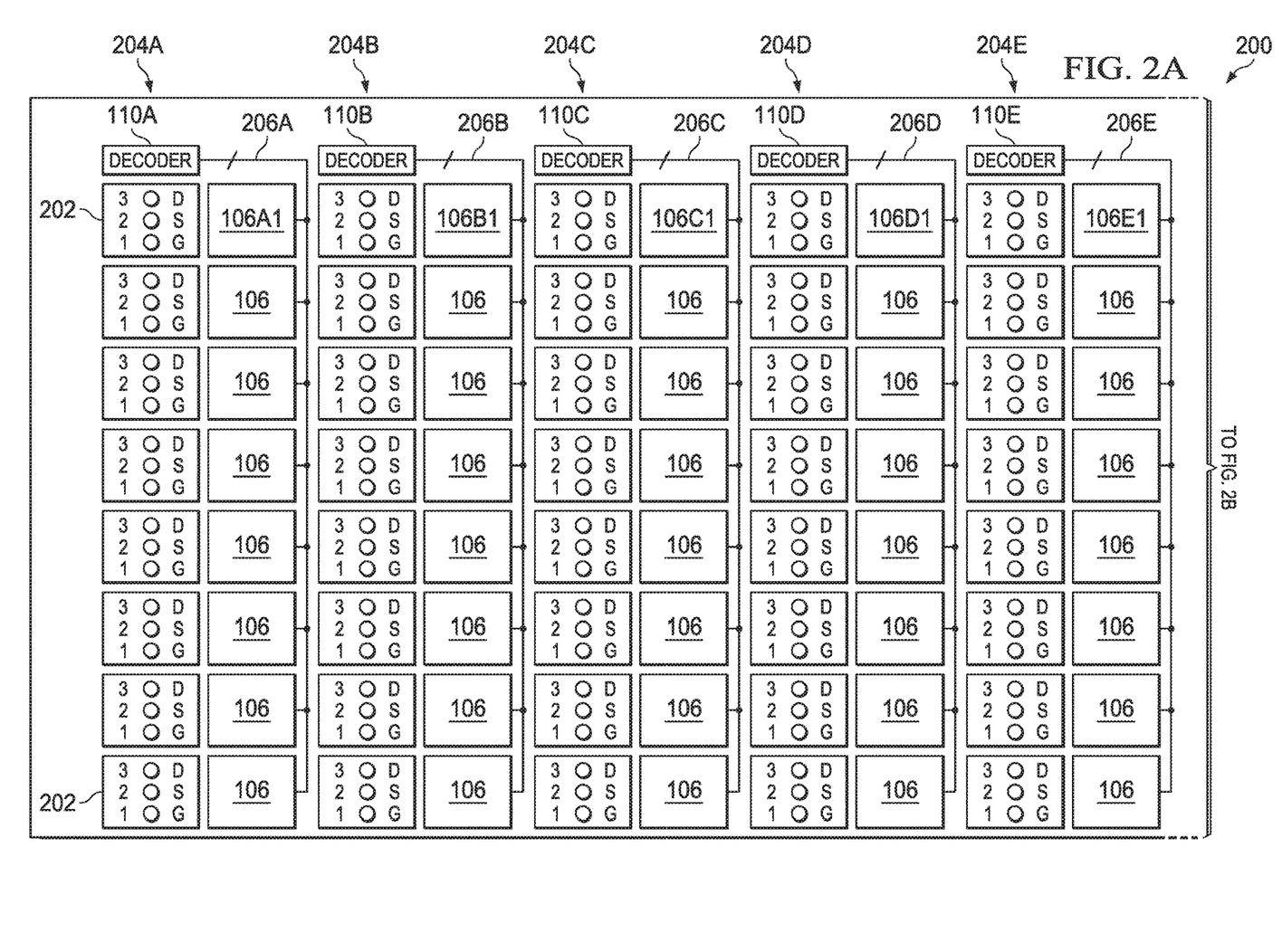
FIGS. 2A-2B show a block diagram of a portion of the system of FIG. 1 in accordance with various examples.
Figure 2B:
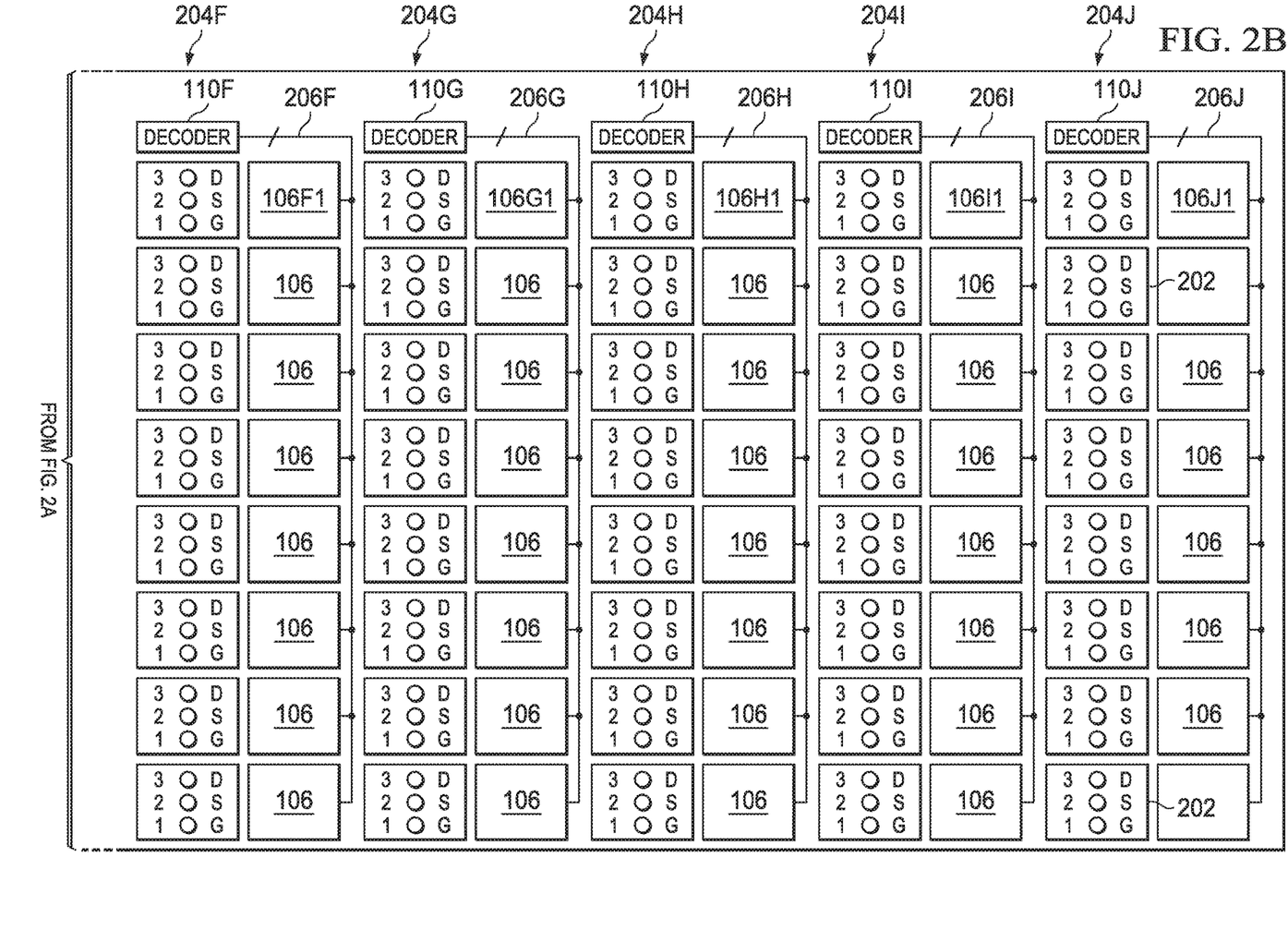

FIGS. 2A-2B show a block diagram of a portion 200 of a burn-in board 102 in accordance with embodiments. Burn-in board 102 may include the capacity to hold any suitable number of DUTs. In this example, eighty DUTs are used. Each DUT is inserted in one of eighty sockets 202 which are arranged in ten columns 204A-204J, with each column 204 comprising eight sockets 202. Associated with each column 204 is a decoder 110A-110J. Each socket 202 has an associated driver 106. As described further below, an output of each driver is configured to drive the gate electrode of a DUT when inserted in the corresponding socket 202. Each output of a decoder 110A-110J is coupled to one of the eight drivers associated with the sockets 202 in the corresponding column 204A-204J, as shown by connections 206A-206J. Connections 206A-206J are shown to illustrate the relationship between decoders 110A-110J and the respective drivers 106, and they do not necessarily represent printed circuit trace routing on burn-in board 102. Although the example burn-board 102 in FIGS. 2A-2B includes eighty sockets 202 for receiving DUTs, other embodiments of burn-in boards may provide for various numbers of DUTs for Rdson screening in accordance with the principles disclosed.

Figure 3:
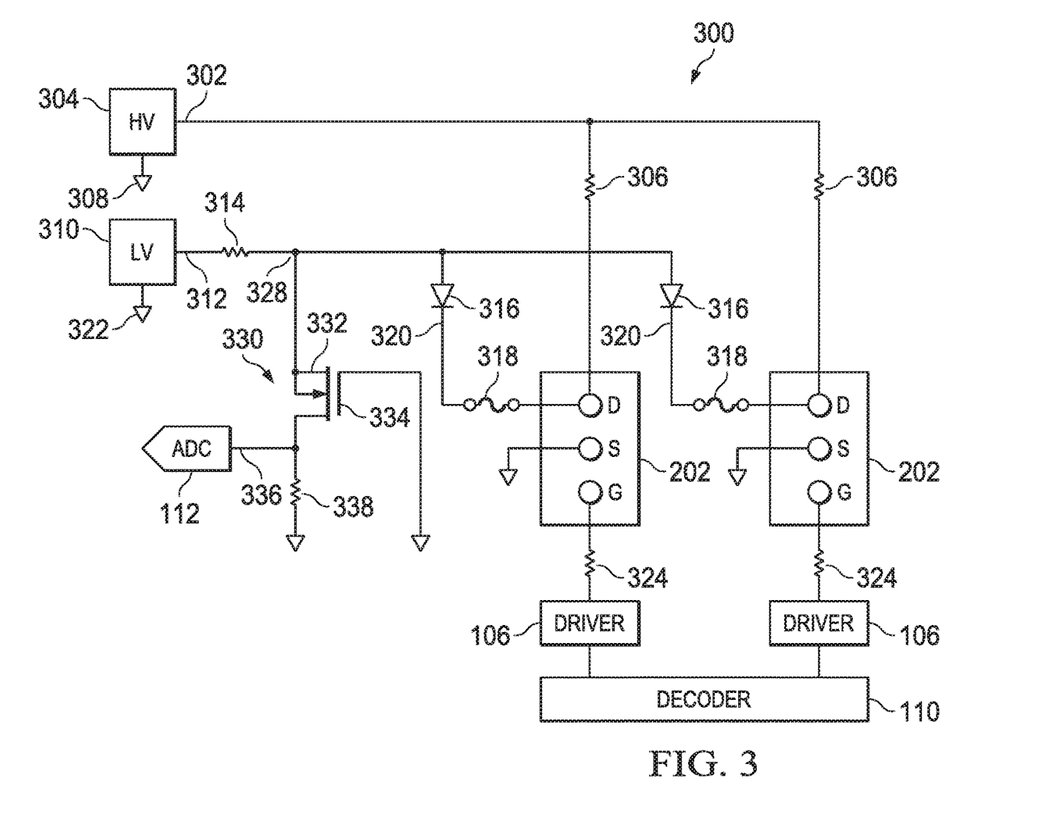
FIG. 3 shows a schematic diagram of a portion of the system of FIG. 1 in accordance with various examples.

The principles of the disclosure may be further understood by referring to FIG. 3, which shows a schematic diagram of a portion 300 of a system (e.g., system 100 of FIG. 1) to characterize Rdson in a plurality of GaNFET devices. In FIG. 3, only two sockets 202 are shown for ease of illustration. A positive terminal 302 of a high voltage (HV) power supply 304 is coupled via resistors 306 to the drain terminals (D) of sockets 202. Resistors 306 may be about 100,000 ohms, for example. A second terminal 308 of HV power supply 304 defines a reference potential and is coupled to ground. In at least some embodiments, an output voltage of HV power supply 304 is about 500 volts. In other embodiments, the output voltage is in the range from about 250-500 volts, and in still other embodiments, in the range from about 400 volts to 550 volts, and in still further embodiments in the range from about 150 volts to 750 volts (all ranges inclusive of the specified voltages). HV power supply 304 provides for the application of a stress voltage to the DUTs while the DUTs are in their off state. A second, low-voltage (LV) power supply 310 is also coupled to the drain terminals of sockets 202 and is configured to provide a drain-source current Ids to the DUTs during testing. A positive terminal 312 is coupled via series resistors 314, diodes 316 and fuses 318 to the drain terminals of each socket 202. Diodes 316 isolate the LV power supply 310 from the high voltage provided by HV power supply 304. In some embodiments, LV power supply 310 is coupled to HV power supply 304 at the drain terminals of socket 202. The diodes 316, being reverse biased, inhibit current flow from HV power supply 304 to LV power supply 310. A second terminal 322 of LV power supply 310 defines a reference potential and is also connected to ground. The source terminals (S) of sockets 202 are also connected to ground which thus serves as the reference potential for system 100 (FIG. 1). In at least some embodiments, an output voltage of LV power supply 310 is about 50 V, and resistors 314 are each about 50 ohms. In this example, Ids in a DUT in its on state is about 1 A. In at least some embodiments, HV power supply 304 and LV power supply 310 may be components of power supplies 118 (FIG. 1).

Drivers 106 are coupled to the gate (G) terminals of corresponding sockets 202 via series resistors 324. In at least some embodiments, resistors 324 may be about 3000 ohms (3 kohm). In other embodiments, other values of resistors 324 may be used, or the resistors 324 may be omitted altogether. Resistors 324 serve to mitigate ringing that may arise from parasitic inductances and capacitances associated with the traces on a burn-in board. Consistent with the disclosure, the values may be adjusted accordingly to accommodate various burn-board layouts. A decoder 110 is coupled to each of drivers 106 as described above and in further detail below.

An ADC 112 samples a voltage at node 328 via an n-type MOSFET (NFET) 330 which serves as a clamp to protect ADC 112 from voltages that exceed its safe input range. NFET 330 is a depletion mode device, which may be, for example, a IXTP6N100D2 NFET from IXYS CORPORATION®, Milpitas, Calif. In other embodiments, various depletion mode NFET devices may be used. With the gate electrode 334 of NFET 330 grounded, before a DUT switches from its off state to its on state, the voltage at node 328 (which appears at the source 332 of NFET 330) is sufficiently high that NFET 330 is below threshold. In other words, the gate-source voltage is negative and below the threshold voltage of NFET 330, thereby isolating input 336 of ADC 112. When the DUT is in its on state, the voltage at the drain of the DUT (not shown in FIG. 3) drops to a low value (e.g., in the millivolt range). The voltage, denoted V0, at node 328 is based on the Vds of a DUT. V0 comprises a forward voltage drop across the diode 316, a voltage drop across the fuse 318, and the Vds of the DUT. This voltage may be in the range of about 1 to 2 V. The voltage V0 at node 328 appears at source 332 of NFET 330. The voltage V0 may be such that the gate-source voltage of NFET 330 rises above threshold and NFET 330 turns on, coupling node 328 to input 336 of ADC 112. In the exemplary embodiment in FIG. 3, a value of about 400 ohms for resistor 338 may be used with an ADC 112 having a maximum input voltage of 3.3 volts. However, in alternative embodiments with ADCs 112 having other maximum input voltages, the value of resistor 338 may be adjusted accordingly. Once the total voltage drop across the diodes 316 and fuses 318 stabilizes, the measurement of V0 via ADC 112, and, in particular, the change in V0 as a function of time provides a measurement of the change in Rdson as a function of time. Stabilization of the total voltage drop across the diodes 316 and fuses 318 is determined via the calibration fixture 111 disposed on the burn-in board 102 (FIG. 1), as described further below.

Figure 4:
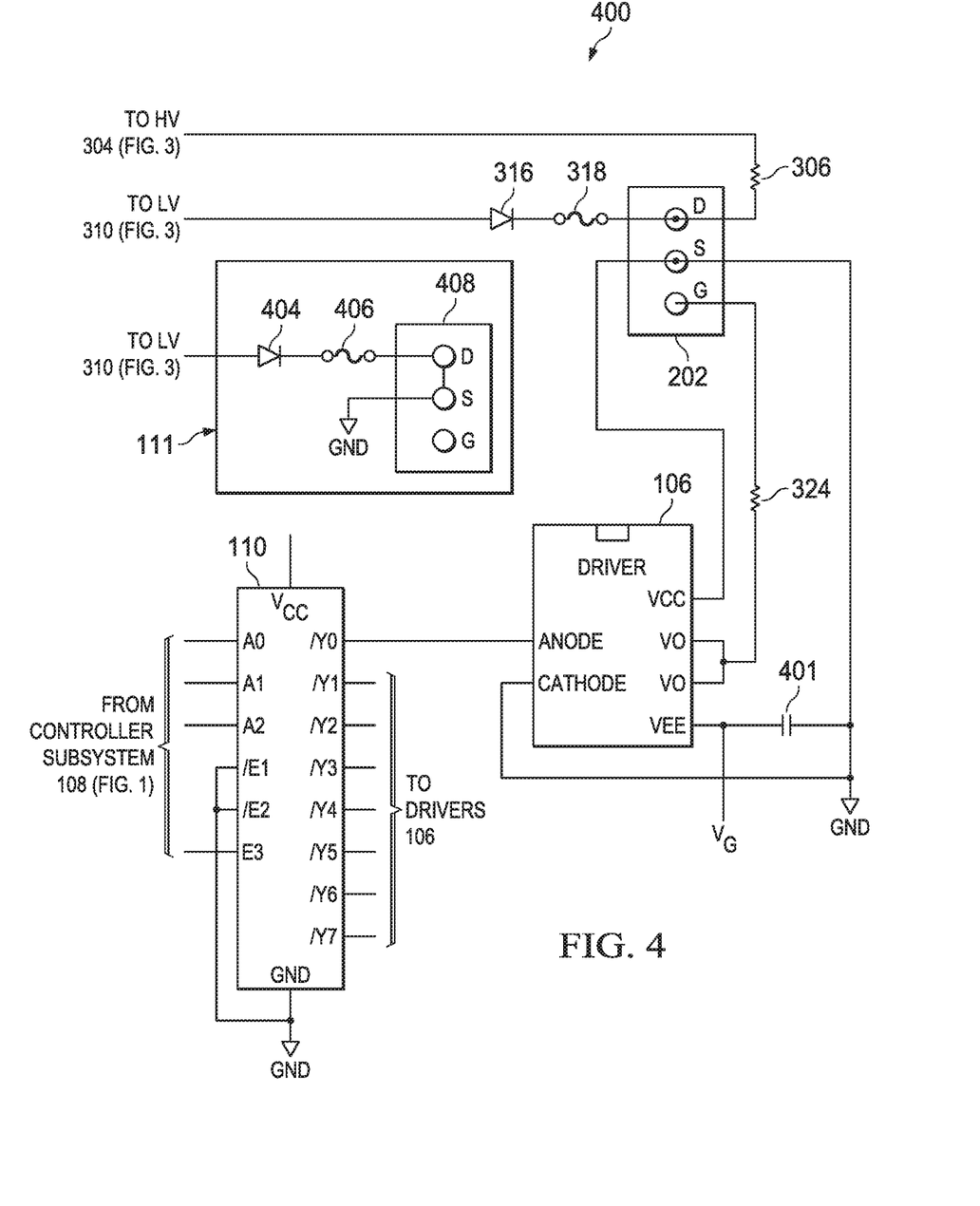
FIG. 4 shows a schematic diagram of a portion of the system of FIG. 1 in accordance with various examples.

FIG. 4 shows an illustrative schematic of a portion 400 of system 100. Portion 400 is disposed on a burn-in board 102

(FIG. 1). Portion 400 includes decoder 110 illustratively embodied as a 3-of-8 decoder having three inputs labeled A0-A2 that are configured to receive a three-bit binary value. Only one decoder 110 is shown for ease of illustration. As described above in conjunction with FIGS. 2A-2B, an exemplary burn-in board portion 200 includes ten decoders 110. Inputs A0-A2 are coupled to controller subsystem 108 (FIG. 1; not shown in FIG. 4). Responsive to the three-bit binary value at the inputs A0-A2, the decoder 110 may assert one of eight outputs, labeled /Y0-/Y7. Thus, by way of example, if the binary value 000 is set on inputs A0-A2, output /Y0 may be asserted and the remaining outputs may be negated. If, for example, the binary value 101 (i.e., decimal 5) is set on inputs A0-A2, decoder 110 may assert output /Y4 and may negate the rest of the outputs. Each of the inputs A0-A2 of the ten decoders 110A-110J in the example burn-in board portion 200 (FIGS. 2A-2B) is coupled in parallel to outputs on controller subsystem 108 (FIG. 1). In some embodiments, each of decoders 110A-110J (FIGS. 2A-2B) receives the same three-bit binary input value. Further, the outputs /Y0-/Y7 may be held in their negated state in response to the states on the enable inputs /E1, /E2, E3. The inputs /E1 and /E2 may be active low as denoted by the "/" in accordance with standard nomenclature. Thus, in the example embodiment in FIG. 4, with /E1 and /E2 tied to ground, the states of outputs /Y0-/Y7 as enabled or disabled may be controlled by the logic value at enable input E3, which is coupled to controller subsystem 108 (FIG. 1). In the example embodiment of the burn-in board portion 200 in FIGS. 2A-2B, each of decoders 110A-110J is coupled to a different output on controller subsystem 108 (FIG. 1). The operation of enable input E3 in conjunction with controller subsystem 108 will be described further below. In at least some embodiments, decoder 110 may be a low-voltage CMOS logic family (LVC) integrated circuit such as an SN74LVC238 device from TEXAS INSTRUMENTS, INC®., Dallas, Tex.

Still referring to FIG. 4, each output of a decoder 110 is coupled to a corresponding driver 106, as described above in conjunction with FIGS. 2A-2B and 3 (only one shown in FIG. 4, for simplicity.) A positive voltage appropriate to the device (e.g., 3 volts for a LVC family device) is coupled to the positive power terminal (labeled as the VCC terminal of decoder 110) and the GND terminal is coupled to ground. The positive voltage may be provided by one of power supplies 118 (FIG. 1). Based on the three-bit binary value that controller subsystem 108 asserts on inputs A0-A2, the DUTs (not shown in FIG. 4) are selectively turned on via drivers 106, as described above and further below. In some embodiments, controller subsystem 108 sequentially outputs a set of binary values to each of the decoders 110.

Drivers 106, in at least some embodiments, may comprise optocoupler devices to provide isolation between the gate of a DUT and the decoders 110. Each of the outputs /Y0-/Y7 of a decoder 110 provides a control signal to a corresponding one of a driver 106 control terminal. For example, in an optocoupler-based driver 106, the outputs of a decoder 110 are coupled to the anode of an internal light-emitting diode (LED) within the driver 106 (not visible in FIG. 4). Thus, the anode of the internal LED may serve as the control terminal of the driver 106. For simplicity, only one output /Y0 of decoder 110 is shown coupled to the anode of the driver 106. The remaining outputs /Y1-/Y7 may be coupled to each remaining driver 106, such as those associated with one of the columns 204A-204J (FIGS. 2A-2B). The cathode of the internal LED of each driver 106 may be coupled to ground.

A gate voltage $V_G$ suitable to cut off the DUT may be coupled to the negative terminal VEE of driver 106. For example, $V_G$ may be about −12 volts for a high-voltage GaNFET device. In at least some embodiments, $V_G$ may be provided by one of power supplies 118 (FIG. 1). The gate terminal G of socket 202 may be coupled to the parallel-connected output terminals VO of driver 106. The positive power supply terminal of driver 106, VCC, is coupled to ground. Likewise, the source terminal S of socket 202 is also grounded. Each remaining driver 106, such as those associated with a corresponding one of the columns 204A-204J (FIGS. 2A-2B) may be similarly connected. When the output /Y0 of decoder 110 is negated such that the internal LED in driver 106 is off, the negative terminal VEE of driver 106 is coupled to the output terminals VO, and $V_G$ is thereby coupled to the gate terminal G of socket 202 via a resistor 324. Terminal VEE is also coupled to ground via bypass capacitor 401 having an illustrative value of 0.1 microfarads in this embodiment. Thus, in operation, a DUT inserted in socket 202 is turned off. Conversely, when output /Y0 of decoder 110 is asserted such that the internal LED in driver 106 is on, terminal VCC (connected to ground) is coupled to the output terminals VO of driver 106 and thus to the gate terminal G of socket 106. Thus, in operation, a DUT inserted in socket 202 turns on. One such device that may be used in an embodiment of drivers 106 is an HPCL-3180 available from AVAGO TECHNOLOGIES®, San Jose, Calif., among others.

As described in conjunction with FIG. 3, the drain terminal of a socket 202 is coupled to the LV and HV power supplies, 310 and 304, respectively (FIG. 3). HV power supply 304 (FIG. 3) is coupled via resistor 306 to the drain terminal of socket 202. LV power supply 310 (FIG. 3) is coupled to the drain terminal via diode 316 and fuse 318. In at least some embodiments, diodes 316 may be a BYG21M diode from VISHAY INTERTECHNOLOGIES, INC.®, Malvern, Pa. Fuse 318, in the example of FIG. 4, may be a 1 amp device. However, other values may be used in alternative embodiments to accommodate different DUTs.

Still referring to FIG. 4, calibration fixture 111 may include a diode 404, fuse 406 and a socket 408. The cathode of diode 404 is connected to one terminal of fuse 406 and the other terminal of fuse 406 is connected to the drain terminal of socket 408. Diode 404 and fuse 406 may be of the same type (i.e., sharing one or more electrical characteristics) as diodes 316 and fuses 318, respectively. The drain and source terminals of socket 408 may be connected together and the source terminal may be connected to ground. The anode of diode 404 may connect to LV power supply 310 (FIG. 3). In operation, a burn-in board 102 is maintained at an elevated test temperature—for example, 125° C. The voltage drop across the diodes 316 and fuses 318, and likewise diode 404 and fuse 406, is temperature dependent. The voltage drop becomes constant once the temperature in the oven 104 (FIG. 1) stabilizes. By monitoring the voltage drop across the diode 404 and fuse 406 in calibration fixture 111 (e.g., using a similar setup as is used for the sockets 202), the stabilization of the temperature at the preselected value (e.g., 125° C.) is determined. As previously described, once the temperature is stabilized, the voltage drop across diodes 316 and fuses 318 (FIG. 3) is substantially constant, and a measurement of the change in V0 as a function of time reflects the change in Rdson in time with respect to DUTs that exhibit current collapse.

Figure 5:
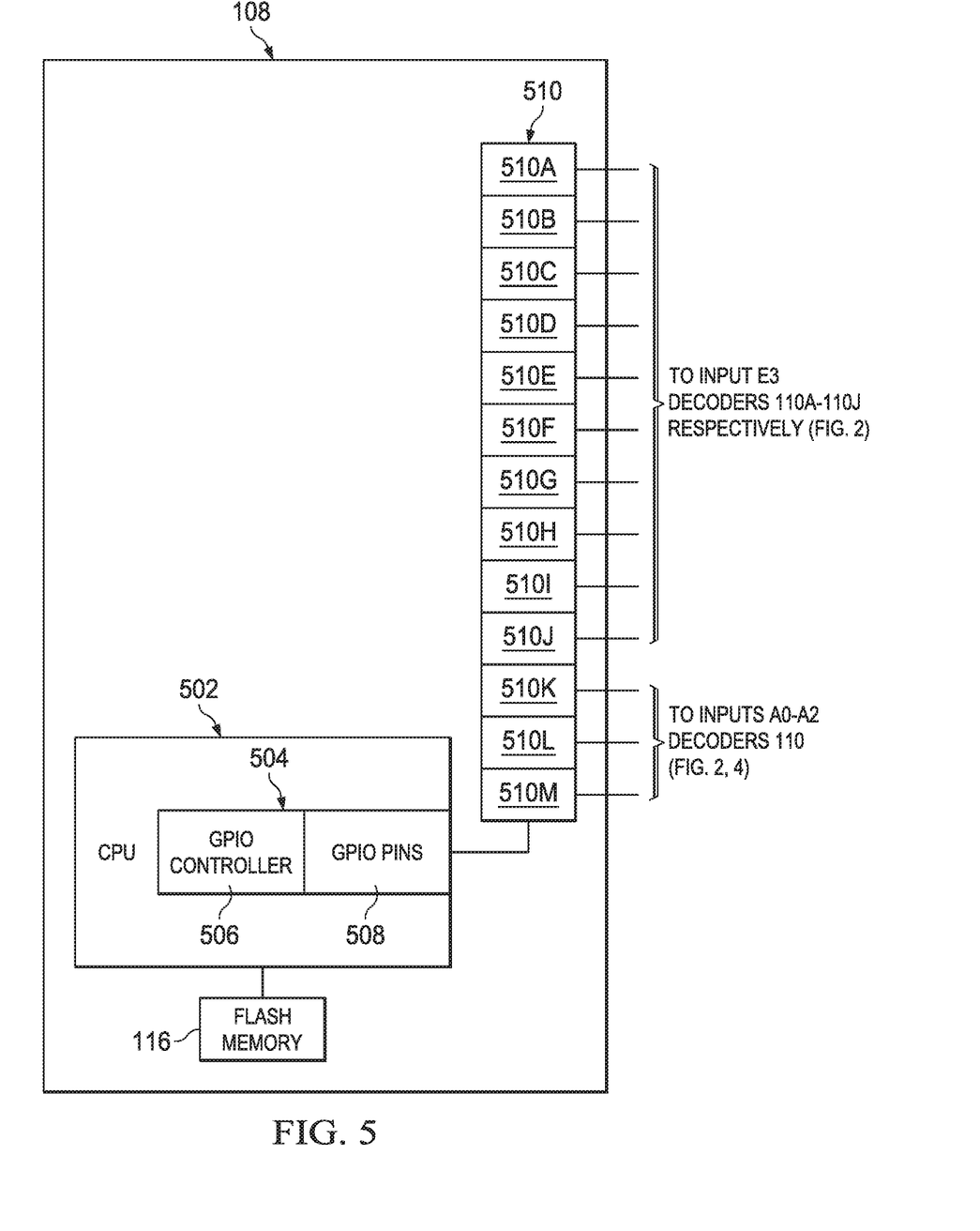
FIG. 5 shows a block diagram of a controller subsystem in accordance with various examples.

FIG. 5 shows a block diagram of a controller subsystem 108 in further detail. Controller subsystem 108 may include a CPU 502 coupled to flash memory 116, which stores firmware for execution by CPU 502. The firmware may include program instructions for performing the operations for characterizing the Rdson of a plurality of DUTs in accordance with embodiments of the process described further below. An exemplary controller subsystem 108 may be based on a Beaglebone Black platform, promulgated by BEAGLE BOARD® Foundation, Oakland Township, Mich. CPU 502 may include a general purpose input/output (GPIO) module 504, including a GPIO controller 506 and a plurality of GPIO pins 508. The GPIO pins 508 provide bi-directional GPIO ports whose states are either set or read, as the case may be, via GPIO controller 506. In an embodiment based on the Beaglebone Black platform, GPIO controller 506 is accessed via a software application program interface (API) which includes functionality for setting the directionality of each of the GPIO pins 508. Reading or writing, as the case may be, the states of each of the GPIO pins 508 is based on the directionality set for the pin. GPIO pins 508 may be coupled to a plurality of GPIO headers 510 comprising GPIO connectors 510A-510M. GPIO connectors 510A-510J may be coupled to the enable inputs E3 of decoders 110A-110J (FIGS. 2A-2B), respectively. GPIO connectors 510K-510M may be connected to the inputs A0-A2, respectively, of the decoders 110 (FIGS. 2A-2B, 3, 4). Thus, a controller subsystem 108 includes outputs configured to sequentially render each control signal into its active state. Each control signal comprises an output of a decoder 110 (FIGS. 2A-2B, 3, 4), and is coupled to a control input of a corresponding driver 106 (FIGS. 2A-2B, 3, 4). In response, the respective driver 106 and a DUT coupled thereto (not shown) turns on. Further, responsive to controller subsystem 108 negating one or more of the outputs on connectors 510A-510J, the control signals comprising the outputs of the corresponding decoders 110 are rendered into their inactive state such that the respective drivers 106 (FIGS. 2A-2B, 3, 4) and any DUT connected thereto are turned off.

Figure 6:
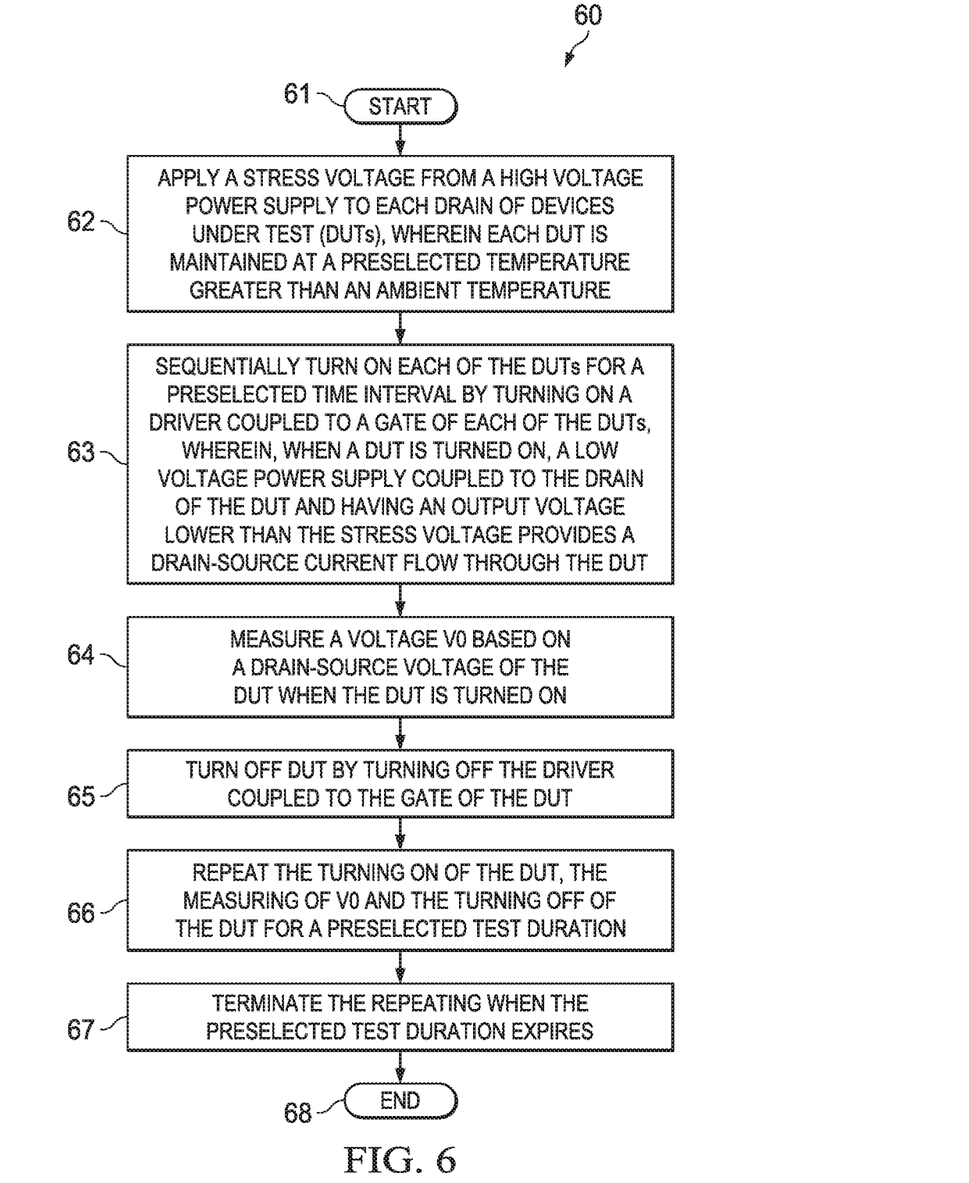
FIG. 6 shows a flowchart of a method in accordance with various examples.
Figure 7A:
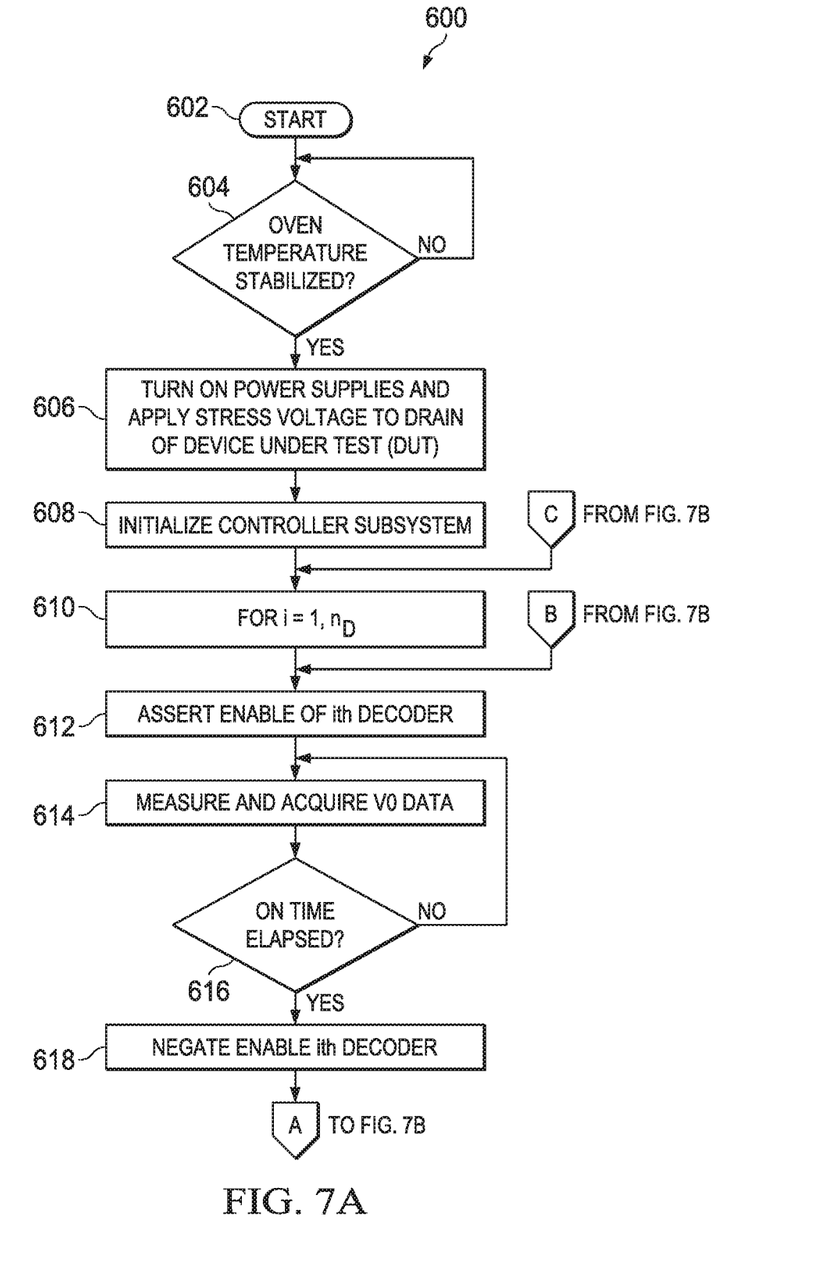
FIGS. 7A-7B show a flowchart of a method in accordance with various examples.
Figure 7B:
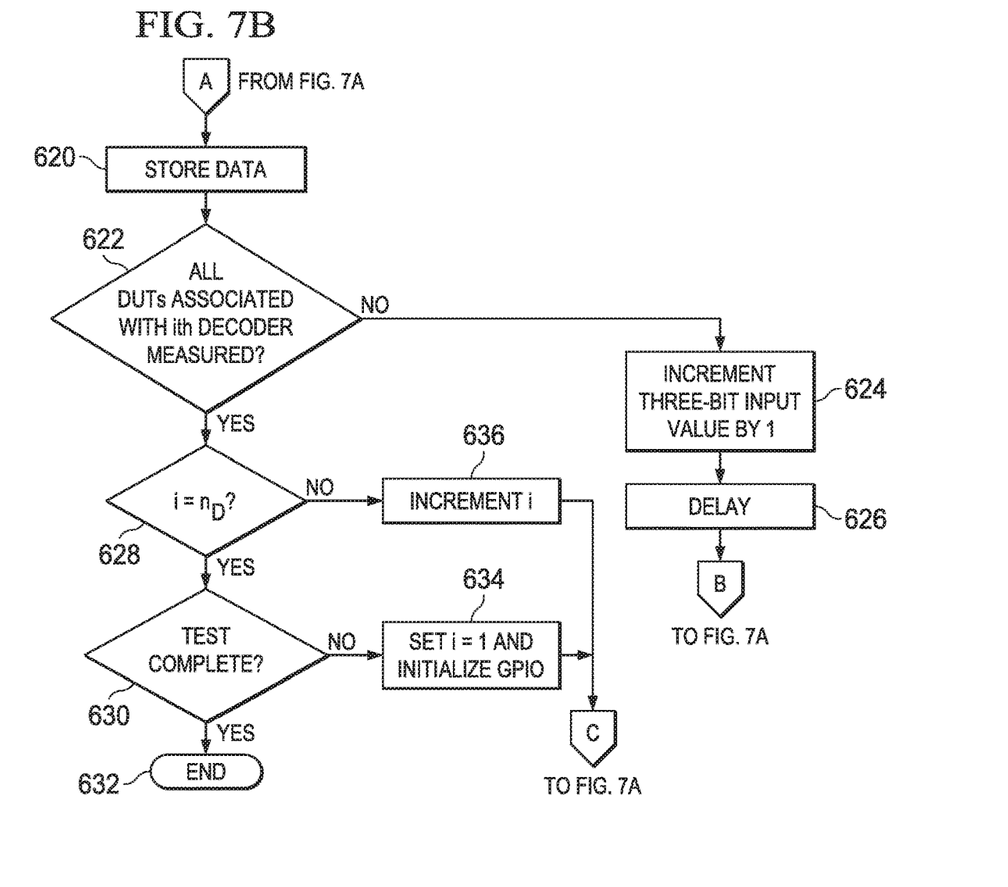

FIGS. 6 and 7A-7B show flowcharts of methods 60 and 600, respectively, for characterizing the change in Rdson of a plurality of DUTs in accordance with embodiments of the disclosure. Method 600 in FIGS. 7A-7B is based on method 60 in FIG. 6. Referring first to FIG. 6, method 60 starts at block 61. In block 62, a stress voltage from a first power supply is applied to each drain of a plurality of DUTs, wherein the DUTs are maintained at a preselected temperature (e.g., 30° C.) or preselected temperature range greater than an ambient temperature. In at least some embodiments, the stress voltage is in the range from 150 volts to 750 volts. In block 63, each DUT is turned on (e.g., sequentially) for a preselected time interval by turning on a driver coupled to a gate of the DUT. When the DUT is turned on, a second power supply coupled to the drain of the DUT and having a voltage lower than the stress voltage provides a drain-source current flow through the DUT. In block 64, a voltage based on a drain-source voltage of the DUT is measured while the DUT is turned on, as previously described. For example, the change in the measured voltage (denoted V0 above) reflects the change in the Rdson characteristic of the DUTs that exhibit current collapse. Measurements may be stored as desired (e.g., in local memory). In block 65, the DUT is turned off by turning off the driver coupled to a gate of the DUT, and in block 66, the sequential turning on, measuring, and turning off is repeated for a preselected test duration. In block 67, after a preselected test duration expires, the repeating is terminated. Method 60 ends at block 68.

FIGS. 7A-7B show a flowchart of a method 600, which is based on method 60. In embodiments of a controller subsystem 108 as described above, method 600 may be implemented at least in part in firmware stored in flash memory 116 (FIGS. 1, 5). Method 600 is described in the context of the example embodiment of a burn-in board 102 having the capability of characterizing eighty DUTs arranged in ten sets (corresponding to columns 204A-204J in FIGS. 2A-2B of eight DUTs each, each set associated with a corresponding decoder 110A-110J). In some embodiments, the principles embodied in method 600 are applicable to other numbers of DUTs and arranged in other numbers of sets including "sets" of one DUT each. The arrangement in FIGS. 2A-2B is by way of example and not limitation.

Method 600 starts at block 602. In block 604, method 600 loops via the "NO" branch of block 604 until the oven temperature is stabilized. Stabilization of the oven temperature may be determined by monitoring the voltage at the calibration fixture 111 as described in conjunction with FIG. 4. After stabilization, the oven temperature maintains a DUT at a preselected elevated temperature above the ambient temperature (e.g., in the range of 75° C. to 250° C., inclusive). When the temperature is stabilized, block 604 exits the loop via its "YES" branch to block 606. In block 606, the high voltage and low voltage power supplies (e.g., HV power supply 304 and LV power supply 310 (FIG. 3)) are turned on or otherwise electrically connected to the burn-in board (e.g., burn-in board 102 (FIG. 1)), and a stress voltage is applied to the drain of a DUT. The stress voltage, which is obtained from the high-voltage supply (e.g., HV power supply 304 (FIG. 3)) is in the range from 150 volts to 750 volts. The controller subsystem (e.g., controller subsystem 108 (FIGS. 1, 5)) is initialized in block 608. In particular, the GPIO pins 508 connected to GPIO connectors 510A-510M (FIG. 5) may be set to their initial states. For example, the initial input value to inputs A0-A2 of decoders 110 (FIG. 5) may be set to 000b by negating GPIO pins 508 corresponding to GPIO connectors 510K-510M. Likewise, the enable input E3 corresponding to each of decoders 110A-110J may be negated, or disabled, by negating GPIO pins 508 coupled to GPIO connectors 510A-510J (FIG. 5).

In block 610, method 600 enters a loop over decoders 110, and correspondingly over the sets of DUTs associated with each decoder as described above. The loop will be described, for simplicity, in terms of a loop index i, which takes values from 1 to the number of decoders $n_D$ (e.g., ten in the embodiment of a burn-in board 102 described in conjunction with FIGS. 2A-2B). In block 612, the enable input E3, corresponding to the ith decoder, is asserted. In other words, in the context of a controller subsystem 108 (FIG. 5) the GPIO pin 508 coupled to the GPIO connector 510 connected to the enable input E3 of the ith controller is asserted. For example, in the context of an embodiment based on a BeagleBone Black platform, firmware instructions may assert the enable by writing the value "1" to a file corresponding to the GPIO pin 508 coupled to the respective GPIO connector 510A-510J. Upon asserting the enable, the output /Y0 of the ith decoder switches logic states from "0" to "1," turning on the driver coupled thereto (e.g., a corresponding one of drivers 106A1-106J1 (FIGS. 2A-2B)) and thus turning on the corresponding DUT. In block 614, V0 data is acquired (e.g., by an ADC 112 (FIGS. 1, 3)). A DUT may be maintained in the on state for a preselected period of time (e.g., 0.3 milliseconds) via a timer block 616 which loops via its "NO" branch back to block 614. At block 614, additional V0 data samples may be acquired and manipulated (e.g., averaged with prior samples). When a preselected "on" time elapses, block 616 exits the loop via its "YES" branch to block 618. In block 618, the enable E3 input of the ith decoder is negated, turning off its corresponding driver and thereby the DUT coupled thereto. In the context of an embodiment based on a BeagleBone Black platform, firmware instructions may assert the enable by writing the value "0" to the file corresponding to the GPIO pin 508 coupled to the respective GPIO connector 510A-510J which, in turn, is coupled to the ith decoder. In block 620, the V0 data acquired at block 614 is stored, for example in flash memory 116 (FIGS. 1, 5). Prior to storing the VO data, in at least some embodiments, the data may be formatted, for example, by formatting the numerical value as a string, adding a timestamp, and inserting the string in a text file stored in the flash memory.

In block 622, it is determined if all the DUTs in the set associated with the ith decoder (e.g., one of columns 204A-204J, FIGS. 2A-2B)), have been measured in the current iteration. If not, block 622 exits via its "NO" branch to block 624. In block 624, the three-bit value provided to inputs A0-A2 of the decoders (e.g., decoders 110, FIG. 4) is incremented by 1. For example, in the context of an embodiment based on a BeagleBone Black platform, firmware instructions may increment the value by 1 from 000b to 001b by writing the value "1" to the file corresponding to the GPIO pin 508 coupled to the GPIO connector 510A (FIG. 5). Firmware instructions may increment the value from 001b to 010b by writing the value "0" to the file corresponding to the GPIO pin 508 coupled to the GPIO connector 510A and the value "1" to the file corresponding to the GPIO pin 508 coupled to the GPIO connector 510B (FIG. 5), and so forth.

In at least some embodiments, each DUT may be repeatedly pulsed on at a preselected frequency, for example, 15 Hz. Thus, in the example in FIGS. 2A-2B, based on a burn-in board having a capability of holding eighty DUTs, the time interval between repeated on states in such an embodiment is about 67 milliseconds. Thus, in block 626, the preselected repetition rate of 15 Hz may be achieved by delaying a preselected time interval (e.g., about 0.5 milliseconds). Method 600 returns to block 612 to characterize the next DUT in the set associated with the ith decoder via blocks 612-622. In block 622, if the last DUT in the set has been characterized, block 622 exits its loop by its "YES" branch to block 628.

In block 628, it is determined if the current—i.e., the ith decoder—is the last decoder; that is, if i=$n_D$. If so, block 628 exits its loop via its "YES" branch to block 630. A particular characterization test may run for many hours, cycling repeatedly over the DUTs. If the test is complete, block 630 exits via its "YES" branch and method 600 ends at block 632. Otherwise, block 630 exits via its "NO" branch to block 634 where the GPIO pins 508 are initialized as previously described, the decoder index i is reset to 1, and method 600 returns to block 610 to continue cycling over the DUTs.

Returning to block 628, if the current decoder—i.e., the ith decoder—is not the last decoder, block 628 exits via its "NO" branch to block 636 where the index i is incremented by 1. Method 600 returns to block 610 to continue the loop over the decoders to characterize the DUTs in the set corresponding to the (i+1)st decoder until the test completes as described above. Method 600 ends via blocks 630 and 632 as previously described.

Figure 8:
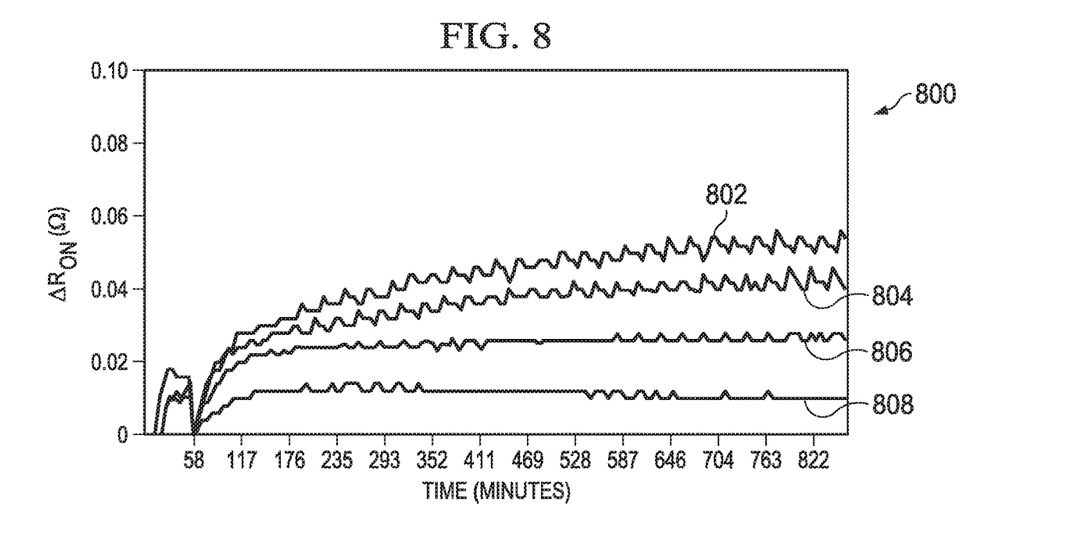
FIG. 8 shows graphs of measured changes in Rdson in accordance with various examples.

FIG. 8 shows plots 800, for four DUTs, of measured changes in Rdson ($\Delta R_{ON}$, in ohms) as a function of time (in minutes). In this example, the test begins at about 60 minutes, when the temperature in the oven has stabilized at its preselected value (e.g., 125° C.), as inferred from monitoring the calibration fixture 111 (FIGS. 1, 4) as previously described. Curves 802 and 804 illustrate DUTs that exhibit current collapse under stress as evidenced by the increase in $\Delta R_{ON}$ with time. Conversely, the DUTs corresponding to curves 806 and 808 have values of $\Delta R_{ON}$ that reach a steady state after a relatively short time, albeit at different values, and maintain a constant $\Delta R_{ON}$ over the duration of the test of about fourteen hours. The DUTs corresponding to curves 806 and 808 would not be characterized as exhibiting current collapse under stress.

The above discussion is meant to be illustrative. Numerous variations and modifications will become apparent to those skilled in the art once the above disclosure is fully appreciated. For example, various test temperatures and stress voltages may be used depending on the specifications of the DUTs. Other examples include the values of various circuit elements, such as resistors, which may vary depending on the specifications of the DUTs, ADC input limits, and the like. It is intended that the following claims be interpreted to embrace all such variations and modifications.

What is claimed is:

1. A method, comprising:
    applying a stress voltage to a drain of each of multiple devices under test (DUTs), wherein each of the DUTs is maintained within a preselected temperature range;
    turning on each of the multiple DUTs for a preselected time interval by turning on a respective driver coupled to a gate of each of the multiple DUTs, wherein turning on a DUT causes a drain-source current to flow through that DUT;
    measuring a plurality of voltages, each of the plurality of voltages based on a drain-source voltage of a different one of the multiple DUTs when that DUT is on; and
    turning off each of the multiple DUTs by turning off the respective drivers corresponding to the DUTs.

2. The method of claim 1, further comprising repeating the turning on, measuring, and turning off for a preselected test duration.

3. The method of claim 1, wherein the preselected temperature is greater than an ambient temperature associated with the multiple DUTs.

4. The method of claim 1, wherein turning on each of the multiple DUTs comprises sequentially turning on the DUTs, and wherein turning off each of the multiple DUTs comprises sequentially turning off the DUTs.

5. The method of claim 1, further comprising determining that the preselected temperature has stabilized before applying the stress voltage and turning on each of the multiple DUTs.

6. The method of claim 5, wherein determining that the preselected temperature has stabilized comprises measuring a total voltage drop across a diode and a fuse on a calibration fixture subject to the preselected temperature.

7. The method of claim 6, wherein each of the plurality of voltages includes the corresponding drain-source voltage and another total voltage drop across another diode and another fuse, the another diode shares an electrical characteristic with the diode and the another fuse shares another electrical characteristic with the fuse.

8. The method of claim 1, further comprising determining a drain-source resistance for each of the multiple DUTs using the drain-source current corresponding to that DUT and the measured voltage corresponding to that DUT.

9. A method of manufacturing a Gallium-Nitride Field Effect Transistor (GaNFET) device, comprising:
    applying a stress voltage to a drain of each of multiple GaNFET devices under test (DUTs) on the semiconductor device, wherein each of the DUTs is maintained within a preselected temperature range;

turning on each of the multiple DUTs for a preselected time interval by turning on a respective driver coupled to a gate of each of the multiple DUTs, wherein turning on a DUT causes a drain-source current to flow through that DUT;

measuring a plurality of voltages, each of the plurality of voltages based on a drain-source voltage of a different one of the multiple DUTs when that DUT is on;

turning off each of the multiple DUTs by turning off the respective drivers corresponding to the DUTs;

determining a drain-source resistance for each of the multiple DUTs using the drain-source current corresponding to that DUT and the measured voltage corresponding to that DUT; and screening out DUTs of the multiple DUTs when the drain-source resistance indicates current collapse.

10. The method of claim 9, further comprising repeating the turning on, measuring, and turning off for a preselected test duration.

11. The method of claim 9, wherein the preselected temperature is greater than an ambient temperature associated with the multiple DUTs.

12. The method of claim 9, wherein turning on each of the multiple DUTs comprises sequentially turning on the DUTs, and wherein turning off each of the multiple DUTs comprises sequentially turning off the DUTs.

13. The method of claim 9, further comprising determining that the preselected temperature has stabilized before applying the stress voltage and turning on each of the multiple DUTs.

14. The method of claim 13, wherein determining that the preselected temperature has stabilized comprises measuring a total voltage drop across a diode and a fuse on a calibration fixture subject to the preselected temperature.

15. The method of claim 14, wherein each of the plurality of voltages includes the corresponding drain-source voltage and another total voltage drop across another diode and another fuse, the another diode shares an electrical characteristic with the diode and the another fuse shares another electrical characteristic with the fuse.

* * * * *